(12) United States Patent
Yoshida et al.

(10) Patent No.: US 6,897,495 B2
(45) Date of Patent: May 24, 2005

(54) FIELD EFFECT TRANSISTOR AND MANUFACTURING METHOD THEREFOR

(75) Inventors: Seikoh Yoshida, Tokyo (JP); Takahiro Wada, Tokyo (JP); Hironari Takehara, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 124 days.

(21) Appl. No.: 10/270,708

(22) Filed: Oct. 11, 2002

(65) Prior Publication Data

US 2003/0082860 A1 May 1, 2003

(30) Foreign Application Priority Data

Oct. 31, 2001 (JP) .......................................... 2001-334718
Nov. 27, 2001 (JP) .......................................... 2001-361183

(51) Int. Cl.⁷ .................. H01L 31/0328; H01L 31/0336
(52) U.S. Cl. ........................ 257/192; 257/193; 257/194; 257/197
(58) Field of Search ................................. 257/192–197, 257/103, 77

(56) References Cited

U.S. PATENT DOCUMENTS

| | | | | |
|---|---|---|---|---|
| 4,639,275 A | * | 1/1987 | Holonyak, Jr. ................ | 438/36 |
| 4,662,058 A | * | 5/1987 | Cirillo et al. ................. | 438/168 |
| 4,766,471 A | * | 8/1988 | Ovshinsky et al. ............. | 257/53 |
| 4,916,498 A | * | 4/1990 | Berenz ......................... | 257/194 |
| 5,068,705 A | * | 11/1991 | Tran ............................ | 257/273 |
| 5,424,227 A | * | 6/1995 | Dietrich et al. .............. | 438/320 |
| 5,536,953 A | * | 7/1996 | Dreifus et al. ................ | 257/77 |
| 5,929,467 A | * | 7/1999 | Kawai et al. ................. | 257/192 |
| 5,979,096 A | * | 11/1999 | Ferdinandsen et al. ........ | 40/768 |
| 6,448,648 B1 | * | 9/2002 | Boos ........................... | 257/751 |
| 6,486,502 B1 | * | 11/2002 | Sheppard et al. ............. | 257/194 |
| 6,489,639 B1 | * | 12/2002 | Hoke et al. ................... | 257/194 |
| 6,528,405 B1 | * | 3/2003 | Martinez et al. ............. | 438/602 |
| 6,576,927 B2 | * | 6/2003 | Yoshida et al. ................ | 257/67 |
| 6,586,781 B2 | * | 7/2003 | Wu et al. ...................... | 257/194 |
| 6,690,035 B1 | * | 2/2004 | Yokogawa et al. ........... | 257/77 |
| 6,690,042 B2 | * | 2/2004 | Khan et al. .................. | 257/192 |

* cited by examiner

*Primary Examiner*—Michael Lebentritt
(74) *Attorney, Agent, or Firm*—Oblon, Spivak, McClelland, Maier & Neustadt, P.C.

(57) ABSTRACT

GaN-based FET has a sapphire substrate of about 50 nm thick on which an n-type GaN electron transit layer and an $Al_{0.2}Ga_{0.8}N$ electron supply layer are formed, together with $n^+$-type GaN contact regions sandwiching the electron transit and supply layers therebetween. On the entire faces of these layer and regions is formed a polyimide interlayer insulating film of about 3000 nm thick that is formed with contact holes in which source, drain and gate electrodes are formed, each of which is comprised of a TaSi/Au layer and about 5000 nm in thickness. The source and drain electrodes are ohmic-connected to the $n^+$-type GaN contact regions and the gate electrode is in contact with an $SiO_2$ gate insulating film.

19 Claims, 16 Drawing Sheets

FIELD EFFECT TRANSISTOR AND MANUFACTURING METHOD THEREFOR

BACKGROUND OF THE INVENTION

1. Technical Field

The present invention relates to a field effect transistor (FET), and more particularly, to a GaN-based FET having a channel layer constituted by a GaN-based semiconductor and a manufacturing method therefor.

2. Related Art

GaN-based FETs and metal-insulator semiconductor FETs (MISFETs) using a wide bandgap semiconductor such as GaN, AlGaN have received much attention as a power device for high power application since they are one order of magnitude or more smaller in on-resistance than FETs using Si, GaAs or the like, and are hence operable at higher temperature with higher current and can withstand high voltage application.

In conventional GaN-based FETs, however, since a lift-off method is adopted for electrode formation, it is difficult to form electrodes with a sufficient thickness so as to make electrode resistance sufficiently small. FETs have their on-resistance determined by electrode resistance as well as contact resistance between electrodes and corresponding respective regions of the FETs, and therefore, the on-resistance cannot be made sufficiently small, if the electrode resistance is not small.

As for conventional MISFETs, source and drain regions are formed on a surface of a channel layer by using as a mask a resist pattern formed by photolithography, thereby forming the channel layer between the source and drain regions. Since the dimensional accuracy of resist-pattern formation is not so high as to permit the distance between the source and drain regions (i.e., the length of the channel layer) to be small to the extent that the on-resistance of the MISFETs becomes sufficiently small.

With reference to FIGS. 12–22, an example of a manufacturing method of a conventional GaN-based FET will be explained and drawbacks of the method will be mentioned.

First, an undoped GaN layer 52, an n-type GaN channel layer 54 doped with Si impurity, and an n-type GaN contact region 56 highly doped with Si impurity are crystal-grown on a sapphire substrate 50 in this order. Then, patterning of an $SiO_2$ film 58 formed on the contact region 56 is conducted by the lithography and etching method, thereby forming the $SiO_2$ film 58 into the desired pattern (refer to FIG. 12).

Next, using the patterned $SiO_2$ film 58 as a mask, the contact region 56, the channel layer 54 and the undoped GaN layer 52 are selectively removed by etching, whereby they are formed into a mesa structure for the interelement separation, with a surface of the undoped GaN layer 52 partly exposed (see FIG. 13).

After the $SiO_2$ film 58 is removed by etching, an $SiO_2$ film 60 is formed on the entire surfaces of the exposed undoped GaN layer 52, the contact region 56 and the like. Then, the $SiO_2$ film 60 is selectively removed by the lithography and etching method, to make the contact region 56 exposed (FIG. 14).

Next, using the $SiO_2$ film 60 as a mask, the exposed contact region 56 is removed by etching, to thereby cause the surface of the channel layer 54 to be exposed and separate the contact region 56 into two contact regions 56a and 56b (FIG. 15).

After the $SiO_2$ film 60 is removed by etching, an $SiO_2$ film 62 is formed on the entire surfaces of the exposed undoped GaN layer 52, the exposed channel layer 54, and the contact regions 56a, 56b (FIG. 16).

Next, patterning of a resist film applied to the $SiO_2$ film 62 is conducted by lithography to form the desired resist pattern 64. Using the resist pattern 64 as a mask, the $SiO_2$ film 62 is selectively removed by etching, to thereby form contact holes 66a, 66b in the $SiO_2$ film 62, through which the contact regions 56a, 56b are partly exposed (FIG. 17).

Then, TaSi and Au are sequentially vapor-deposited in layer on the entire faces of the resist pattern 64 and the exposed contact regions 56a, 56b, whereby a TaSi/Au layer 68 is formed with which the contact holes 66a, 66b are filled (see FIG. 18).

Next, using a lift-off method, the resist pattern 64 and most parts of the TaSi/Au layer 68 formed thereon are removed, whereas those parts of the TaSi/Au layer 68 which are filled in and vertically project from the contact holes 66a, 66b are kept remained. As a result, source and drain electrodes 68a, 68b are formed that are constituted by the TaSi/Au layers 68 and in ohmic contact with those parts of the contact regions 56a, 56b which are located beneath the contact holes 66a, 66b (see FIG. 19).

Next, patterning of a resist film applied to the entire surfaces of the $SiO_2$ film 62 and the source and drain electrodes 68a, 68b is made by the lithography method, thereby forming a resist pattern 70 through which a central part of the $SiO_2$ film 62 is exposed. Whereupon, using the resist pattern 70 as a mask, the exposed central part of the $SiO_2$ film 62 is removed by etching, whereby the $SiO_2$ film 62 is formed with a contact hole 72 through which the channel layer 54 located between the contact regions 56a, 56b is exposed (FIG. 20).

Next, Pt and Au are sequentially vapor-deposited in layer on the resist pattern 70 and part of channel layer 54 exposed through the contact hole 72, thereby forming an Au/Pt layer 74 with which the contact hole 72 is filled (see FIG. 21).

Then, using the lift-off method, the resist pattern 70 and the Au/Pt layer 74 are removed, with the Au/Pt layer 74 in the contact hole 72 kept remained. As a result, a gate electrode 74a is formed, which is constituted by the Au/Pt layer 74 filled in the contact hole 72 and Schottky-contacted to the channel layer 54 (FIG. 22). The FET fabrication is thus completed.

As explained above, in the conventional GaN-based FET, the lift-off method is adopted for the formation of source, drain and gate electrodes 68a, 68b and 74a, and therefore, it is difficult to make the thicknesses of these electrodes greater than about 2–3 μm. Thus, the electrode resistance cannot be made sufficiently small, especially for a large-area device, posing a problem that it is difficult to attain satisfactory power characteristics.

The source and drain electrodes 68a, 68b must be formed separately from the gate electrode 74a, using an electrode material different from that for the gate electrode 74a. Accordingly, photolithography, etching and vapor-depositing processes for the lift-off method must be repeated, causing a problem of increased costs due to complicated fabrication processes.

In addition, usage of highly hard sapphire substrate 50 poses a further problem that a difficult is encountered in properly cutting a wafer-into chips in the dicing process which is the final wafer process.

Moreover, the sapphire substrate 50 is extremely poor in heat dissipation, making it difficult for a power device to dissipate heat generated therein. This causes problems of deterioration of electrodes and of badly affecting on characteristics such as drain withstand voltage, on-resistance and the like. To cope with these problems, there is the idea of using a silicon substrate instead of the sapphire substrate 50. However, a method for epitaxial growth of a GaN layer on a silicon substrate has not been established as yet.

In the following, an example of a conventional GaN-based MISFET will be explained with reference to FIG. 37, and drawbacks of the MISFET will be pointed out.

There is shown a sapphire substrate 150 on which sequentially formed in layer are a GaN buffer layer (not shown), an undoped GaN layer (not shown), and a p-type GaN channel layer 152 doped with Mg impurity. By adding n-type impurity such as Si to the channel layer 152 with use of, as a mask, a resist pattern formed on the channel layer 152 by lithography, a central region without n-type impurity being added is formed on a surface of the channel layer 152, and n-type GaN source and drain regions 154, 156 are formed thereon on both sides of the central region, respectively.

On the source and drain regions 154 and 156, source and drain electrodes 158, 160 are formed, each electrode being constituted by an Al/Ti layered structure formed by sequentially vapor-depositing Al and Ti in layer, whereas a gate electrode 164 of an Al/Ti layered structure is formed on a central portion of a gate insulating film 162 constituted by an $SiO_2$ film or the like, which portion is located directly above the central region of the channel layer 152.

The MISFET has a channel region thereof constituted by the central portion of the channel layer 152 between the source and drain regions 154, 156, and has a channel length represented by the length of the channel region.

As understood from the foregoing explanation, the conventional GaN-based MISFET is fabricated in the form of a planar structure as in the case of MISFETs using Si or GaAs.

Instead of using the aforementioned method, the source and drain regions may be formed by making embedding-growth of n-type GaN layers in two recesses that are formed by etching in the p-type GaN channel layer 152, using as a mask a resist pattern formed on the channel layer 152 by photolithography.

At any rate, the channel length L, i.e., the length of the channel layer 152 between the source and drain regions 154, 156 is restricted by the dimensional accuracy of the resist pattern formed on the channel layer 152 and hence cannot be sufficiently shortened. The channel length L of an ordinary GaN-based MISFET is about 6 $\mu$m.

Due to the difficulty in sufficiently decreasing the channel length, the conventional GaN-based MISFET entails a drawback that the on-resistance cannot be made sufficiently small despite that the bandgap of p-type GaN constituting the channel layer 152 is wider than those of Si and GaAs.

A further problem is posed that the contact resistance between the source and drain electrodes 158, 160 and n-type GaN source and drain regions 154, 156 is extremely large, on the average, in the order of $2 \times 10^{-4}$ $\Omega cm^2$.

Theoretically, the on-resistance of MISFETs having a channel layer constituted by a wide bandgap semiconductor such as GaN, AlGaN is one order of magnitude or more smaller than that of MISFETs using Si or GaAs. Nevertheless, a suitable device structure that effectively utilizes such an advantage of wide bandgap semiconductors has not been proposed as yet.

SUMMARY OF THE INVENTION

An object of the present invention is to provide a field effect transistor (FET) which has a small on-resistance, and a manufacturing method therefor.

Another object of the present invention is to provide an FET which is excellent in power characteristics and which can be fabricated by simplified processes at low costs, and a manufacturing method therefor.

Still another object of the present invention is to provide an FET which has a sufficiently small on-resistance and can withstand high voltage application, and a manufacturing method therefor.

According to one aspect of the present invention, there is provided a field effect transistor which comprises: a channel layer constituted by a wide bandgap semiconductor; a source region provided on a first side of the channel layer; a drain region provided on a second side of the channel layer; an insulating resin film comprised of a voltage- and heat-resistant resin, the insulating resin film being so formed as to cover the channel layer, the source region and the drain region and being formed with first, second and third through openings; and gate, source and drain electrodes constituted by electrode materials that are individually filled in the first, second and third through openings.

According to another aspect of the present invention, there is provided a manufacturing method for a field effect transistor, which comprises: a first step of forming a channel layer, a source region and a drain region on a substrate, the channel layer being constituted by a wide bandgap semiconductor, the source and drain regions being individually arranged on first and second sides of the channel layer; a second step of forming an insulating resin film constituted by a voltage- and heat-resistant resin so as to cover the channel layer, the source region and the drain region; a third step of forming first, second and third through openings in the insulating resin film; and a fourth step of filling electrode materials into the first, second and third through openings, thereby forming gate, source and drain electrodes.

According to the present invention, electrodes of a field effect transistor are formed by electrode materials filled into through openings formed in an insulating resin film, and therefore, the electrodes can be made thick to the extent that the field effect transistor has a sufficiently small electrode resistance, whereby the on-resistance of the transistor can be sufficiently small, and a satisfactory power characteristic can be achieved. In addition, by filling the same electrode material into the through openings for electrode formation, the field effect transistor can be fabricated at low costs with simplified fabrication processes.

According to the present invention, a field effect transistor can be fabricated in the form of a layered structure comprised of a channel layer vertically sandwiched between source and drain regions. With such a field effect transistor in which the channel length (i.e., the length of the channel layer) corresponds to the thickness of the channel layer, the channel length can be made sufficiently short to make the on-resistance sufficiently small by variably controlling the thickness of the channel layer because the accuracy of thickness control for the channel layer is higher than the dimensional accuracy of a resist pattern conventionally used for channel layer formation.

A field effect transistor according to the present invention is operable at higher temperature and can withstand an extremely high gate voltage, since its channel layer is constituted by a wide bandgap semiconductor.

DETAILED DESCRIPTION

In the following, a GaN-based field effect transistor (FET) according to a first embodiment of this invention will be described.

Figure 1A:
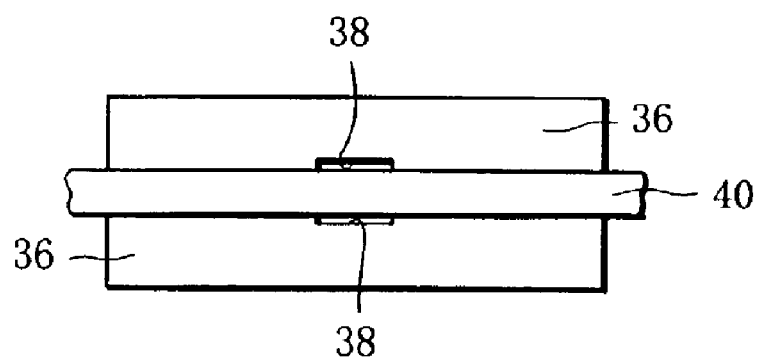
FIG. 1A is a schematic plan view showing a GaN-based FET according to a first embodiment of this invention.
Figure 1B:
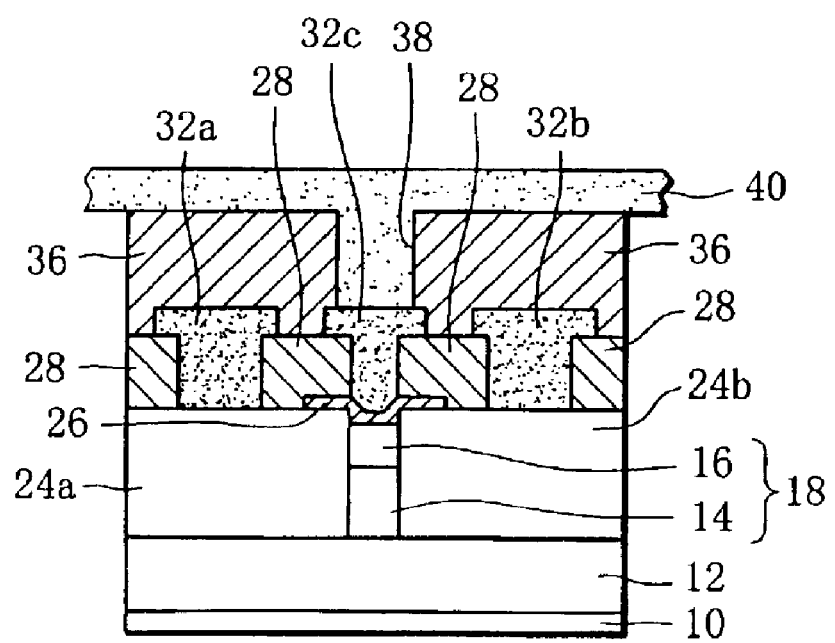
FIG. 1B is a schematic section view of the FET shown in FIG. 1A.

As shown in FIGS. 1A and 1B, the GaN-based FET of this embodiment has a high electron mobility transistor (HEMT) structure and includes a sapphire substrate 10 of about 50 μm thick on which undoped GaN layer 12 of about 2000 nm thick, an n-type electron transit layer 14 of about 50 nm thick doped with Si impurity at concentration of about $2 \times 10^{17}$ $cm^{-3}$, and an $Al_{0.2}Ga_{0.8}N$ electron supply layer 16 of about 30 nm thick are sequentially formed in layer.

Since the n-type GaN electron transit layer 14 and the $Al_{0.2}Ga_{0.8}N$ electron supply layer 16 formed thereon constitute a heterojunction structure, two-dimensional electron gas supplied from the electron supply layer 16 to the vicinity of the junction between the layers 14, 16 is present in the electron transit layer 14, in addition to electrons serving as majority carries in the layer 14. Hereinafter, the electron transit layer 14 and the electron supply layer 16 are collectively referred to as an n-type channel layer 18, which has a gate length of about 2 μm and a gate width of about 20 cm, measured along the lateral and depth directions of the drawing, respectively.

$N^+$-type GaN contact regions 24a, 24b doped with Si impurity at concentration of about $2 \times 10^{19}$ $cm^{-3}$ are formed on opposite ends of the undoped GaN layer 12, with the n-type channel layer 18 sandwiched therebetween. These $n^+$-type GaN contact regions 24a, 24b are connected to the n-type electron transit layer 14, and have their surfaces which are at a higher vertical position than a surface of the $Al_{0.2}Ga_{0.8}N$ electron supply layer 16 interposed between the contact regions. The surface of the electron supply layer 16 cooperates with the adjacent surfaces of the contact regions 24a, 24b to form a recessed portion.

An $SiO_2$ gate insulating film 26 is formed, which covers the surface of the electron supply layer 16 and partly covers the surfaces of the contact regions 24a, 24b. Instead of the $SiO_2$ gate insulating film, a gate insulating film made of SiN, AlN, polyimide or the like may be employed.

An interlayer insulating film 28 of about 3000 nm thick serving as an insulating resin film is formed so as to cover the entire surfaces of the contact regions 24a, 24b and the gate insulating film 26. The interlayer insulating film is constituted by polyimide serving as a voltage-resistant and heat-resistant resin. Contact holes 30a, 30b and 30c (FIG. 7) serving as first, second and third through openings are formed in the interlayer insulating film 28 so as to vertically extend therethrough.

A source electrode 32a, a drain electrode 32b, and a gate electrode 32c are formed in the contact holes 30a, 30b and 30c of the interlayer insulating film 28, respectively. Each electrode is constituted by a TaSi/Au layer comprised of TaSi and Au layered thereon, wherein TaSi serves as an electrode material which has a good adhesion with the $SiO_2$ gate insulating film 26 and has a small contact resistance with the $n^+$-type GaN contact regions 24a, 24b. The source and drain electrodes 32a, 32b are in ohmic contact with the contact regions 24a, 24b, respectively, and the gate electrode 32c is in contact with the gate insulating film 26.

The source, drain and gate electrodes 32a, 32b and 32c are insulated and separated from one another by means of the polyimide interlayer insulating film 28, and each have a thickness of 5000 nm, for instance, greater than that of the interlayer insulating film 28. As an electrode material, a layer of WSi/Au, TaSi, WSi or the like may be employed instead of the TaSi/Au layer.

A polyimide interlayer insulating film 36 of, e.g., about 3000 nm thick is formed on the entire surfaces of the interlayer insulating film 28 and the electrodes 32a, 32b and 32c, and is formed with a contact hole 38 vertically extending therethrough. A wiring layer 40 is formed in the contact hole 38, which layer is constituted by an Au layer that is ohmic contact with the gate electrode 32c.

Although illustrations are omitted, interelement separation is achieved by mesa isolation in the GaN-based FET of a HEMT structure according to the present embodiment.

Next, a method for manufacturing the GaN-base FET of this embodiment will be explained.

First, an undoped GaN layer 12 of about 2000 nm thick is crystal-grown on a sapphire substrate 10 of about 430 μm thick by means of the molecular beam epitaxy (MBE) or metal organic chemical vapor deposition (MOCVD) method using an ultra-high vacuum growth apparatus, with trimethyl gallium (TMG; $Ga(CH_3)_3$) and $NH_3$ used as materials.

Next, using, e.g., TMG, $NH_3$, and $SiH_4$ as materials, an n-type GaN electron transit layer 14 of about 50 nm thick doped with Si impurity at concentration of $2 \times 10^{17}$ $cm^{-3}$ is crystal-grown. Further, using, e.g., trimethyl aluminum (TMA; $Al(CH_3)_3$) and $NH_3$ as materials, an $Al_{0.2}Ga_{0.8}N$ electron supply layer 16 of about 30 nm thick is crystal-grown. Thus, a layered structure of the undoped GaN layer 12, n-type GaN electron transit layer 14 and $Al_{0.2}Ga_{0.8}N$ electron supply layer 16 is formed, in which the layers 14 and 16 constitute a heterojunction structure, i.e., an n-type channel layer 18.

Figure 2:
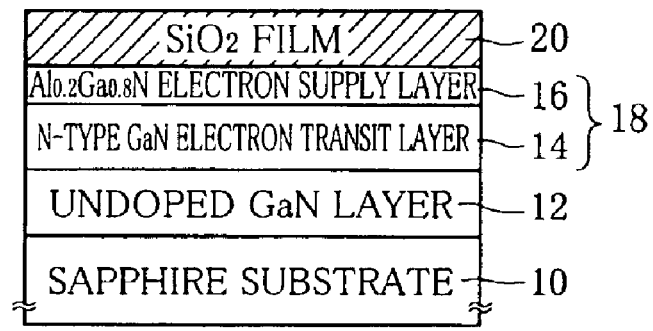
FIG. 2 is a schematic section view showing a first process stage of a method for manufacturing the GaN-based FET shown in FIGS. 1A and 1B.

Next, an $SiO_2$ film 20 of 200 nm thick is formed on the electron supply layer 16 by means of the thermochemical vapor deposition or plasma CVD method (refer to FIG. 2). Instead of the $SiO_2$ film 20, an SiN or AlN film may be formed.

Figure 3:
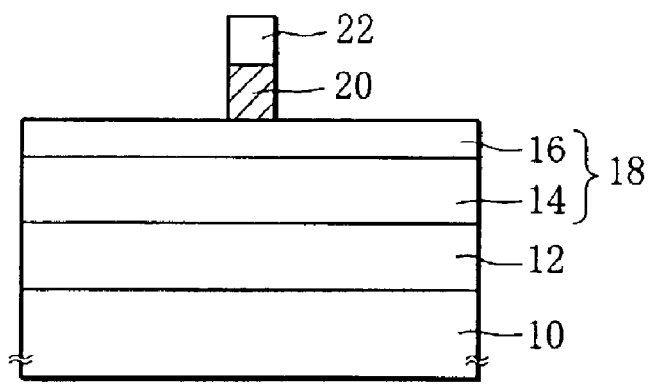
FIG. 3 is a section view showing a second process stage of the manufacturing method.

After a resist film is applied onto the $SiO_2$ film 20, patterning of the $SiO_2$ film 20 is conducted to form the desired resist pattern 22 (refer to FIG. 3).

Next, using the resist pattern 22 as a mask, patterning of the $SiO_2$ film 20 is made by the wet etching method using BHF or the dryetching method using $CF_4$. Subsequently, the resist pattern 22 is removed by using acetone or methanol or by oxygen ashing.

Figure 4:
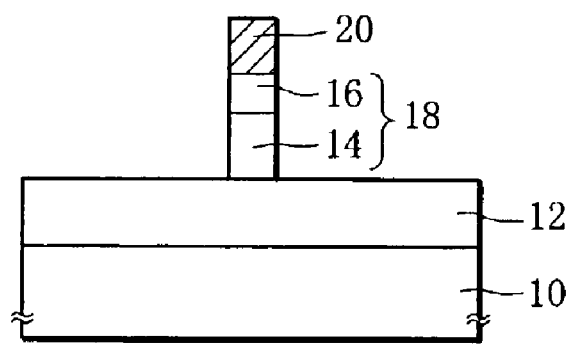
FIG. 4 is a section view showing a third process stage.

Then, using the patterned $SiO_2$ film 20 as a mask, most parts of the $Al_{0.2}Ga_{0.8}N$ electron supply layer 16 and the n-type GaN electron transit layer 14 are removed by the electron cyclotron resonance (ECR) etching or reactive ion beam etching (RIBE) method using methane-based gas, for instance, whereby most parts of the surface of the undoped GaN layer 12 are exposed, and the n-type channel layer 18 comprised of the electron supply layer 16 and the electron transit layer 14 has a gate length of 2 μm and a gate width of 20 cm, respectively measured along the lateral and depth directions of the drawings (see FIG. 4).

Figure 5:
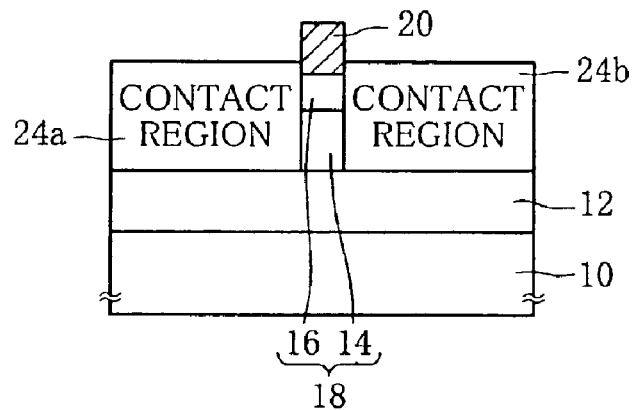
FIG. 5 is a section view showing a fourth process stage.

Subsequently, using the $SiO_2$ film 20 as a mask, an $n^+$-type GaN contact regions 24a, 24b doped with Si impurity at concentration of $2 \times 10^{19}$ $cm^{-3}$ is crystal-grown on the exposed surface of the undoped GaN layer 12 by the MBE or MOCVD method using TMG, NH3 and SiH4 as materials, so that the contact regions 24a, 24b have their surfaces which are at a higher vertical position than the surface of the electron supply layer 16 of the channel layer 18 (see FIG. 5).

Although illustrations are omitted, an $SiO_2$ film, for instance, is formed on the entire surfaces of the $SiO_2$ film 20 and the contact regions 24a, 24b, and patterning of the $SiO_2$ film thus formed is conducted by lithography and etching. Thereafter, using the patterned $SiO_2$ film as a mask, the contact regions 24a, 24b are partly removed by etching, thereby forming a mesa shape to achieve interelement separation of GaN-based FETs.

Subsequently, the patterned $SiO_2$ and the $SiO_2$ film 20 are removed by etching. The exposed surface of the electron supply layer 16 is at a vertical position lower than the surfaces of the contact regions 24a, 24b.

Then, an $SiO_2$ film of 50 nm thick is formed on the entire surfaces of the electron supply layer 16 and the contact regions 24a, 24b by means of the thermal CVD or plasma CVD method, and patterning of the $SiO_2$ film is conducted by lithography and etching whereby an $SiO_2$ gate insulating film 26 is formed, which covers a recessed surface of the electron supply layer 16 and those parts of the contact regions 24a, 24b which are adjacent thereto. Instead of the $SiO_2$ gate insulating film 26, an insulating film made of SiN, AlN, polyimide or the like may be formed.

Figure 6:
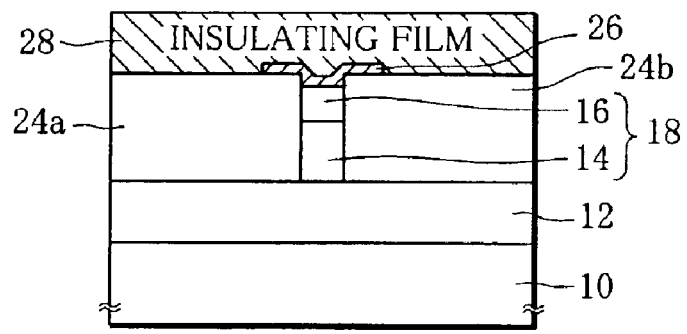
FIG. 6 is a section view showing a fifth process stage.

Next, an interlayer insulating film 28 of about 3000 nm thick is formed on the entire surfaces of the contact regions 24a, 24b and the $SiO_2$ gate insulating film 26 (see FIG. 6).

Figure 7:
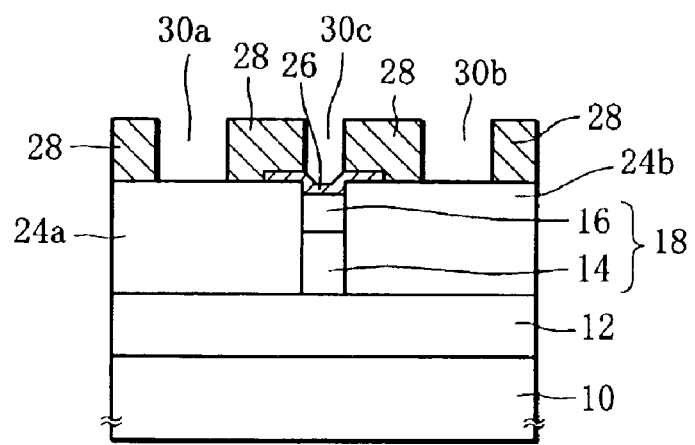
FIG. 7 is a section view showing a sixth process stage.

Then, the polyimide interlayer insulating film 28 are partly removed, thereby forming the insulating film 28 with contact holes 30a, 30b and 30c to which the contact regions 24a, 24b and the $SiO_2$ gate insulating film 26 are exposed (refer to FIG. 7).

Figure 8:
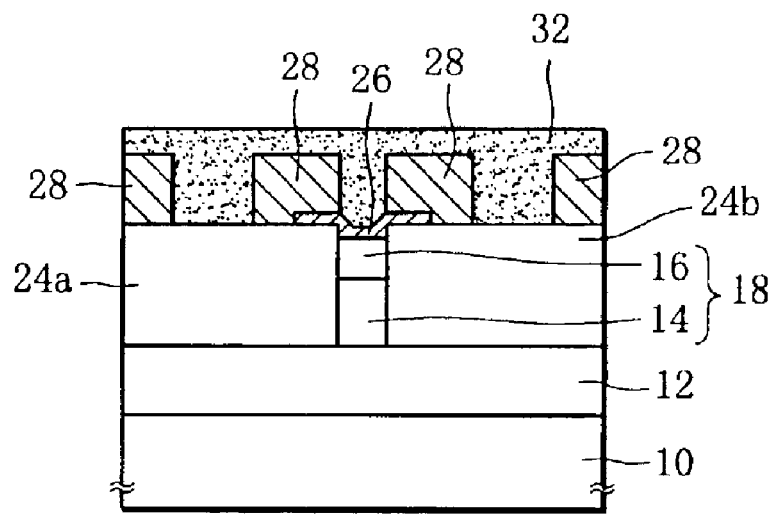
FIG. 8 is a section view showing a seventh process stage.

Next, a TaSi/Au layer 32, which is comprised of TaSi and Au layered thereon, is formed on the entire surface of the interlayer insulating film 28 by means of sputter vapor deposition, with the contact holes 30a, 30b and 30c filed with the TaSi/Au layer 32 (See FIG. 8). The TaSi/Au layer 32, especially TaSi, serves as an electrode material that has excellent adhesion with the $SiO_2$ gate insulating film 26 and a small contact resistance with the $n^+$-type GaN contact regions 24a and 24b. Instead of the TaSi/Au layer 32, a layer of WSi/Au, TaSi, WSi or the like may be formed.

Next, a resist film is applied on the TaSi/Au layer 32, and patterning of the resist film is conducted by lithography to form resist patterns 34a, 34b and 34c.

Using the resist patterns 34, 34b and 34c as a mask, the TaSi/Au layer 32 are partly removed by dryetching, whereby the TaSi/Au layer 32 is formed into the desired pattern. Thus, source and drain electrodes 32a, 32b are formed and at the same time a gate electrode 32c is formed. The source and drain electrodes 32a, 32b are comprised of TaSi/Au layers 32 individually extending through the contact holes 30a, 30b to be in ohmic contact with the $n^+$-type GaN contact regions 24a and 24b, whereas the gate electrode 32c is comprised of the TaSi/Au layer 32 that extends through the contact hole 30c and is in contact with the $SiO_2$ gate insulating film 26.

Figure 9:
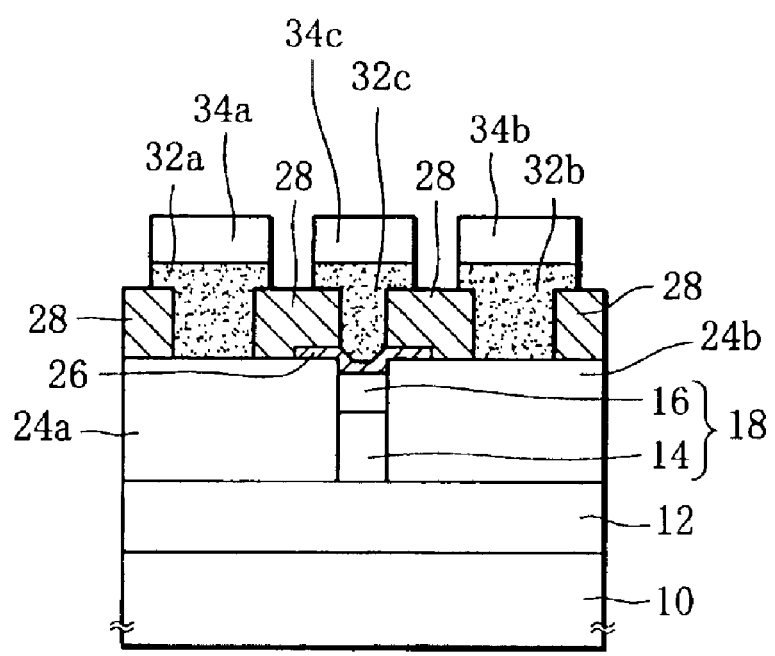
FIG. 9 is a section view showing an eighth process stage.

The source, drain and gate electrodes 32a, 32b and 32c are formed to have a thickness, e.g., about 5000 nm, greater than the thickness of the polyimide interlayer insulating film 28 (see FIG. 9).

Figure 10A:
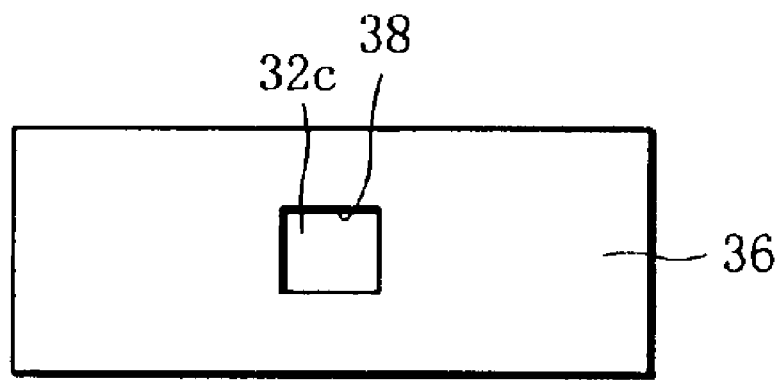
FIG. 10A is a schematic plan view showing a ninth process stage.
Figure 10B:
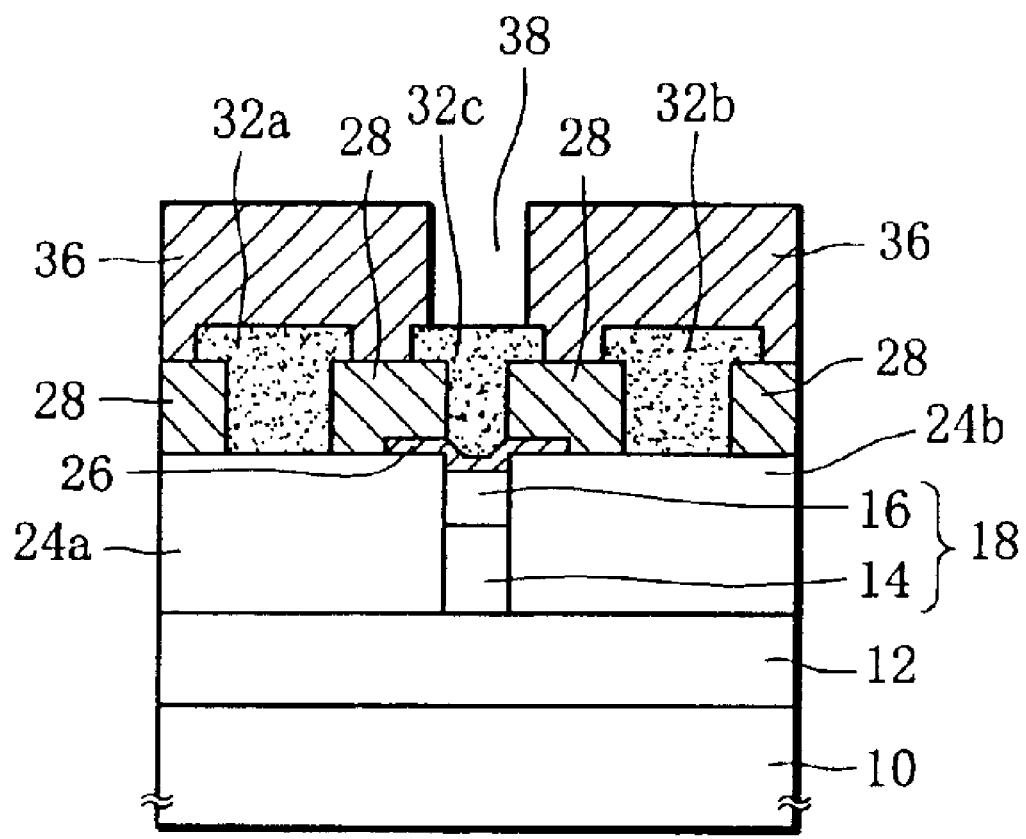
FIG. 10B is a schematic section view showing the ninth process stage.

Using acetone or methanol or by means of oxygen ashing, the resist patterns 34a, 34b and 34c are removed. Then, a polyimide interlayer insulating film 36 of about 3000 nm thick is formed on the entire surfaces of the polyimide interlayer insulating film 28 and of the source, drain and gate electrodes. Subsequently, the interlayer insulating film 36 is partly removed, thereby forming a contact hole 38 to which the gate electrode 32 is exposed (see FIGS. 10A and 10B).

Thereafter, an Au layer is formed on the entire surfaces of the gate electrode 32c and the polyimide interlayer insulating film 36 by means of sputter vapor deposition, and then the Au layer is formed into the desired pattern by means of lithography and etching, whereby a wiring layer 40 is formed, which is comprised of the Au layer extending through the contact hole 38 to be in ohmic contact with the gate electrode 32c.

Figure 11A:
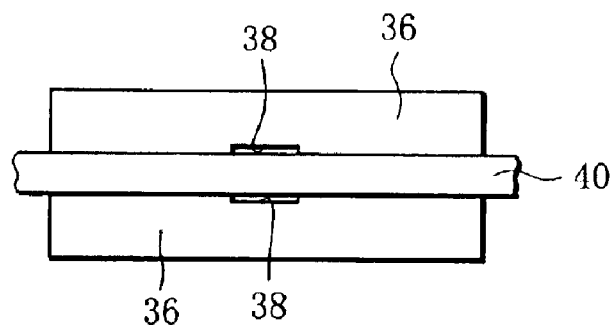
FIG. 11A is a schematic plan view showing a tenth process stage.
Figure 11B:
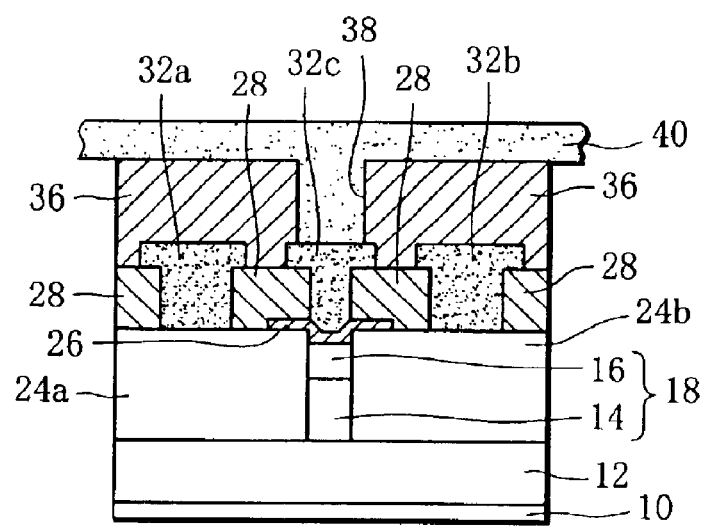
FIG. 11B is a schematic section view showing the tenth process stage.
Figure 12:
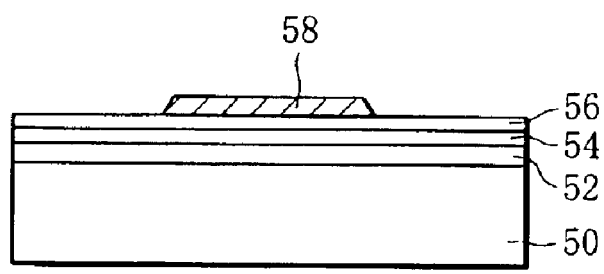
FIG. 12 is a section view showing a first process stage of a method of manufacturing a conventional GaN-based FET.
Figure 13:
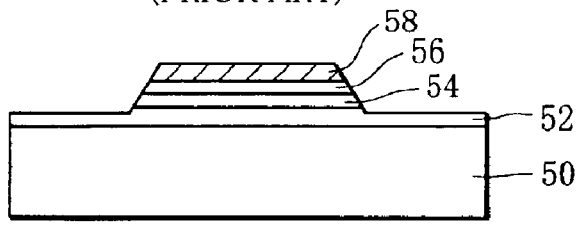
FIG. 13 is a section view showing a second stage of the manufacturing method.
Figure 14:
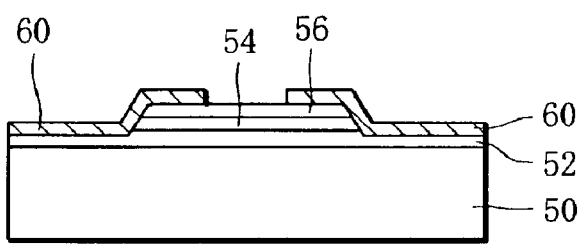
FIG. 14 is a section view showing a third process stage.
Figure 15:
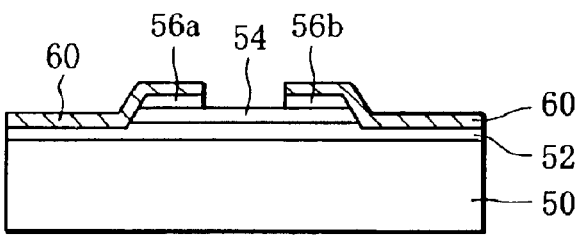
FIG. 15 is a section view showing a fourth process stage.
Figure 16:
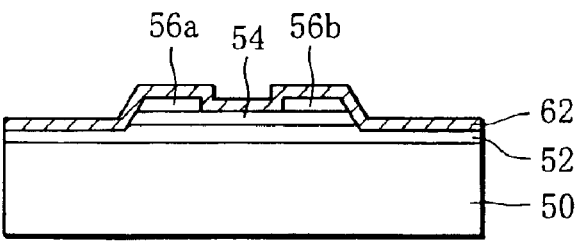
FIG. 16 is a section view showing a fifth process stage.
Figure 17:
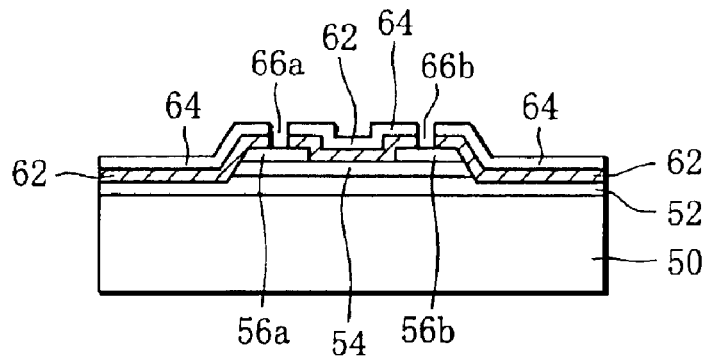
FIG. 17 is a section view showing a sixth process stage.
Figure 18:
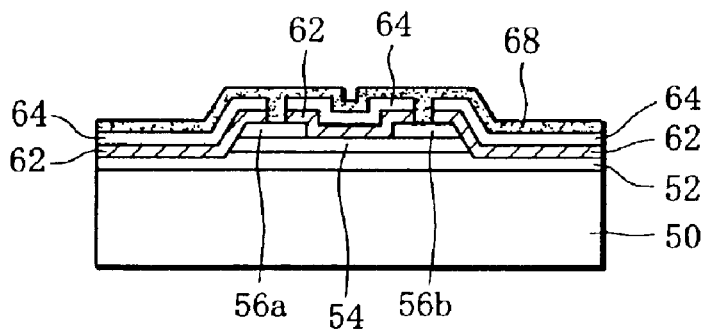
FIG. 18 is a section view showing a seventh process stage.
Figure 19:
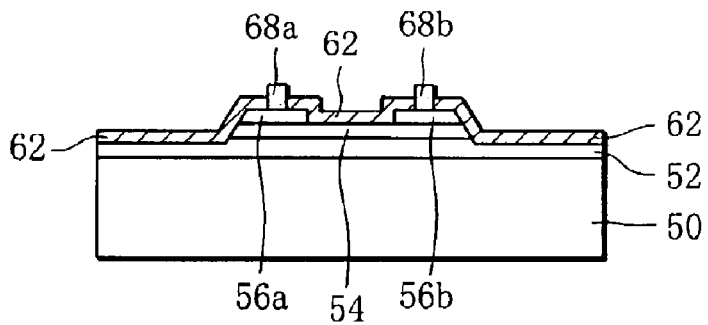
FIG. 19 is a section view showing an eighth process stage.
Figure 20:
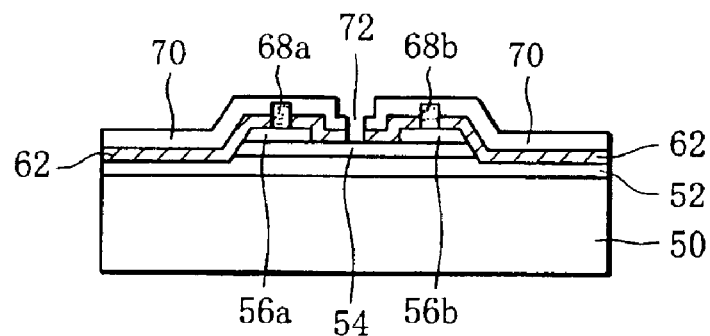
FIG. 20 is a section view showing a ninth process stage.
Figure 21:
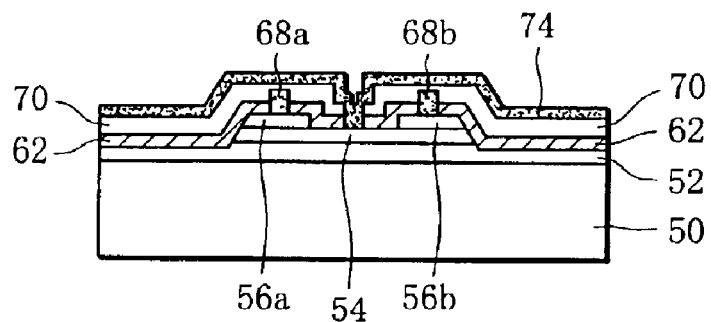
FIG. 21 is a section view showing a tenth process stage.
Figure 22:
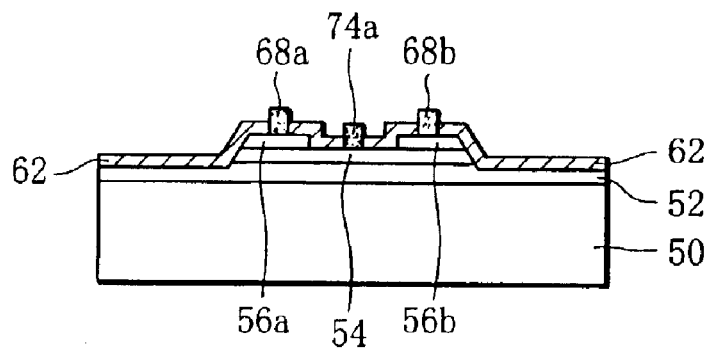
FIG. 22 is a section view showing an eleventh process stage.

Next, using, e.g., a polishing machine, the rear surface of the sapphire substrate 10 is cut off, so that its thickness is reduced from about 430 μm to about 50 μm (see FIGS. 11A and 11B). Thus, the fabrication of the GaN-based FET having a HEMT structure shown in FIGS. 1A and 1B is completed.

The following are results of measurements on characteristics of the GaN-based FET thus fabricated.

The on-resistance, observed at a gate-source voltage VGS of 0 volt, was 50 mΩ/mm$^2$, the maximum value of the gate-source voltage VGS was +4 volts, and the withstand drain-source voltage was 450 volts.

As described above, according to the GaN-based FET of the first embodiment of this invention, the source, drain and gate electrodes 32a, 32b and 32c are formed by TaSi/Au layers 32, which are filled in the contact holes 30a, 30b and 30c formed in the polyimide interlayer insulating film 28 of about 3000 nm thick, and are insulated and separated from one another by means of the polyimide interlayer insulating film 28. Accordingly, these electrodes 32a, 32b and 32c each have a thickness of about 5000 nm that is thicker than the thickness of the polyimide interlayer insulating film 28 and that is far greater than the thickness of 2 to 3 μm of an electrode formed by means of the conventional lift-off method. This makes it possible to sufficiently reduce the electrode resistance of the source, drain and gate electrodes 32a, 32b and 32c, whereby satisfactory power characteristics can be attained.

With an insulating gate structure having the SiO$_2$ gate insulating film 26 interposed between the n-type channel layer 18 and the gate electrode 32c, gate leakage such that electric current flows between the source, drain and gate electrode 32a, 32b and 32c can be prevented, and at the same time an enhancement-type FET can be attained. Furthermore, the source and drain electrodes 32a, 32b respectively ohmic contact with the n$^+$-type GaN contact regions 24a, 24b and the gate electrode 32c in contact with the SiO$_2$ gate insulating film 26 can be simultaneously formed with use of the same electrode material, i.e., the TaSi/Au layer 32. As compared with the conventional manufacturing method in which source and drain electrodes are fabricated separately from a gate electrode with use of different materials, manufacturing processes can be much simplified, contributing to a reduction in fabrication costs.

By polishing the rear face of a sapphire substrate 10, the thickness thereof can be reduced from about 430 μm to about 50 μm. This makes it easy to carry out proper excision of FETs from a chip through dicing process even for a case where the FETs include a sapphire substrate 10 which is hard and poor in heat dissipation. Since the heat dissipation of a FET is improved, deteriorations in electrodes, withstand drain voltage, on-resistance and the like can be prevented, which are attributable to heat generation caused when the FETs are employed as a power device.

An FET according to the first embodiment can be modified variously.

For instance, although an undoped GaN layer 12 is directly layered on a sapphire substrate 10 in the first embodiment, a GaN buffer layer of about 30 nm to 50 nm thick may be formed by the MBE or MOCVD method using an ultra-high vacuum growth apparatus, in order to improve crystalline of a respective semiconductor layer that is to be crystal-grown following the GaN buffer layer.

Instead of an n-type GaN electron transit layer 14, an undoped GaN electron transit layer may be formed. In this case, a residual n-type impurity is present generally at concentration of about $1 \times 10^{16}$ cm$^{-3}$, a p-type impurity such as carbon, Mg and the like is preferably doped to the same level of concentration in order to compensate for the n-type impurity, thereby reducing effective carrier concentration. Alternatively, a p-type impurity may be doped at concentration one order of magnitude or more greater than the residual n-type impurity to that portion of an undoped GaN electron transit layer which is in contact with an Al$_{0.2}$Ga$_{0.8}$N electron supply layer 16, thereby forming a layer in which electrons are prevented from flowing.

An n-type channel layer 18 may be formed by an n-type GaN electron transit layer 14 and an Al$_{0.2}$Ga$_{0.8}$N electron supply layer 16 that are layered in a reverse order as that in the embodiment, with a gate electrode 32c formed on the electron transit layer 14 through an SiO$_2$ gate insulating film 26.

The composition ratio of the electron supply layer 16 is not limited to Al$_{0.2}$Ga$_{0.8}$N, but may be Al$_x$Ga$_{1-x}$N (0<x<1).

For the formation of n$^+$-type GaN contact regions 24a and 24b, a GaN layer may be crystal-grown and then an Si impurity may be injected thereinto by ion implantation, instead of crystal-growing a GaN layer doped with Si impurity.

For simultaneous formation of source, drain and gate electrodes 32a, 32b and 32c, a TaSi/Au layer 32 may be polished by the chemical mechanical polishing (CMP) method until a surface of a polyimide interlayer insulating film 28 is exposed, with the TaSi/Au layer 32 in contact holes 30a, 30b and 30c kept remained, instead of selectively removing the TaSi/Au layer 32 by dryetching with use of resist patterns 34a, 34b and 34c as a mask.

With the just-mentioned method, surfaces of the source, drain and gate electrodes 32a, 32b and 32c can be flattened so as to be flush with one another, making it possible to improve the accuracy of formation of a polyimide interlayer insulating film 36 after the electrode formation, in which film a contact hole 38 for wiring is formed.

As in a GaN-based FET of a HEMT structure explained in the first embodiment, a GaN-based FET of a metal-semiconductor (MES) structure can be fabricated in such a manner that its source, drain and gate electrodes have their thickness greater than that of a polyimide interlayer insulating film by insulating and separating these electrodes from one another by the insulating film, thereby making the electrode resistance sufficiently small to achieve satisfactory power characteristics. In this case, a gate electrode is in Schottky-contact with a channel layer, and therefore, the gate electrode cannot be formed simultaneously with the source and drain electrode using the same electrode material. This requires that the gate electrode be fabricated separately from the source and drain electrode using a different electrode material.

In the following, a GaN-based MISFET according to a second embodiment of this invention will be explained.

Figure 23:
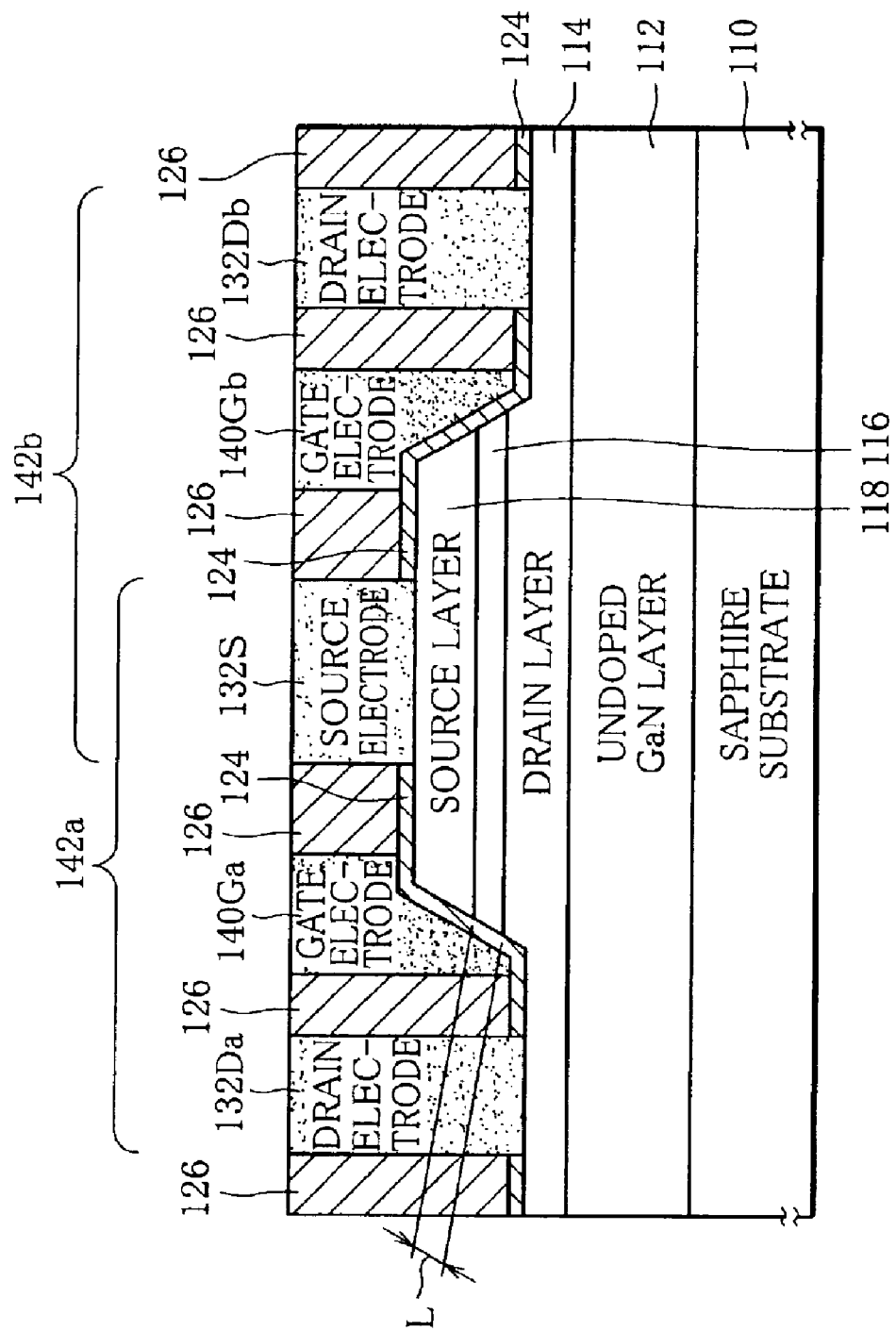
FIG. 23 is a schematic section view showing a GaN-based MISFET according to a second embodiment of this invention.

As shown in FIG. 23, the GaN-based MISFET of this embodiment comprises a substrate 110 that is constituted by semi-insulating sapphire, for instance. On the sapphire substrate 110, a GaN buffer layer (not shown), an undoped GaN layer 112, an n-type GaN drain layer 114, a p-type GaN channel layer 116 of, e.g., 30 nm thick, and an n-type GaN source layer 118 are sequentially formed in layer. That is, the MISFET has a layered structure comprised of the channel layer 116 and the source and drain layers 118, 114 that are individually arranged above and below the channel layer 116.

The layered structure is formed into a mesa shape that has opposite side faces thereof each obliquely extending at a predetermined angle with respect to the direction in which the source, channel and drain layers 118, 116 and 114 are layered. The oblique surfaces of the mesa structure are partly constituted by the opposite side faces of the p-type GaN channel layer 116.

The mesa structure is formed at its one face with an $SiO_2$ gate insulating film 124 so as to cover the oblique side faces of the channel layer 116. The $SiO_2$ gate insulating film 124 is formed with an interlayer insulating film 126, except for its portions where the oblique side faces and source, drain and gate electrodes mentioned later are formed. The interlayer insulating film 126 serving as an insulating resin film is made of a voltage- and heat-resistant resin such as polyimide.

The interlayer insulating film 126 and the $SiO_2$ gate insulating film 124 are formed at their opposite end portions and central portions with three contact holes, serving as first and second through openings, in which a source electrode 132S and two drain electrodes 132Da, 132Db are formed that are in ohmic contact with the n-type GaN source layer 118 and the n-type GaN drain layer 114, respectively. The interlayer insulating film 126 is formed at its intermediate portions with two contact holes, serving as a third through opening, in which two gate electrodes 140Ga, 140Gb are formed that are in contact with the oblique side faces of the $SiO_2$ insulating film 124 located above the oblique side faces of the p-type GaN channel layer 116.

The source and drain electrodes 132S, 132Da and 132Db are each constituted by a TaSi/Au layered structure that is comprised of TaSi and Au layered thereon, TaSi having a small contact resistance with the n-type GaN source layer 118 and the n-type GaN drain layer 114. The gate electrodes 140Ga and 140Gb are each constituted by an Ni/Au layered structure that is comprised of Ni and Au layered thereon, Ni being excellent in adhesion with the $SiO_2$ gate insulating film 124.

The source, drain and gate electrodes 132S, 132Da, 132Db, 140Ga and 140Gb and the interlayer insulating film 126 have their surfaces which are made flush to form a flat surface.

Thus, a first MISFET 142a of enhancement type is constituted by the source, drain and gate electrodes 132S, 132Da and 140Ga. The source and drain electrodes are ohmic contact with the n-type GaN source layer 118 and the n-type GaN drain layer 114, respectively, whereas the gate electrode 140Ga is provided through the $SiO_2$ gate insulating film 124 on the one of the oblique side faces of the p-type GaN channel layer 116 vertically interposed between the source and drain layers 118, 114. Similarly, a second MISFET 142b of enhancement type is constituted by the source and drain electrodes 132S, 132Db individually ohmic contact with the source and drain layers 118, 114 and the gate electrode 140Gb provided on another oblique side face of the channel layer 116 through the $SiO_2$ gate insulating film 124. The first and second MISFETs 142a and 142b are provided on the opposite halves of the mesa structure so as to be adjacent to each other.

In the FET structure having the channel layer 116 of 30 nm thick vertically interposed between the source and drain layers 118 and 114, those parts of the channel layer which are located in the vicinity of the oblique side faces of that layer constitute a channel region having a channel length L represented as a function of the thickness of the channel layer 116 and the angle at which the oblique side face extends with respect to the direction in which the source, channel and drain layers 118, 116 and 114 are layered. For instance, the channel length L is represented by $d \times \sin^{-1}\theta$, where $\theta$ denotes an angle formed between the oblique side face and the layering direction, and d denotes a thickness of the channel layer 116.

With the aforementioned FET structure, under a condition that the slanting angle $\theta$ of the oblique side face of the layered structure is kept constant, the channel length L can be variably controlled by varying the thickness of the channel layer 116. For this reason, the channel length L can be remarkably decreased with ease and with accuracy from the order of $\mu$m to the order of nm. Thus, an MISFET can be attained, which is capable of making switching operations with sufficiently small on-resistance.

With the present embodiment using the p-type GaN channel layer 116 whose bandgap is sufficiently larger than that of Si, GaAs or the like, the resultant FET is operable at higher temperatures and the withstand gate voltage can be greatly increased.

According to measurements conducted by the present inventors in respect of a GaN-based MISFET as shown in FIG. 23, the on-resistance of the MISFET was 10 m$\Omega$cm$^2$ when the gate-source voltage VGS was 0 volt, which resistance is about one order of magnitude smaller than that of the conventional MISFET. The withstand gate voltage greater than 400 volts was obtained.

A combination of the first and second MISFETs 142a, 142b formed at the two oblique side faces of the mesa structure permits the combined MISFETs to operate at a large current, and contributes to making a high-density integrated circuit in which the MISFETs are formed.

In the second embodiment, a case has been explained where the p-type GaN channel layer 116 of 30 nm thick is utilized and the channel length L is 40 nm which is measured along the oblique side face of the channel layer 116. However, the thickness of the channel layer 116 and the channel length, which is determined depending on the thickness and the oblique angle of the channel layer, are not limited thereto but can be varied in accordance with the desired MISFET characteristics.

Figure 24:
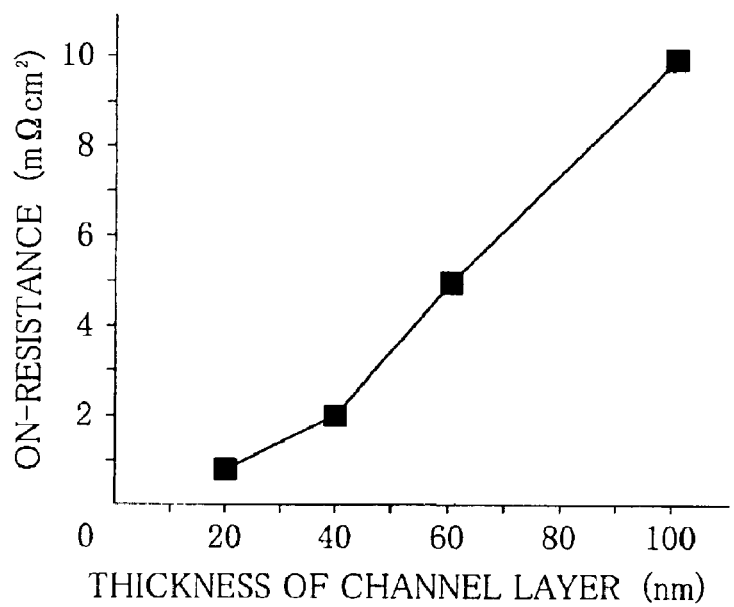
FIG. 24 is a graph showing a relationship between on-resistance and thickness of a p-type GaN channel layer in the GaN-based MISFET shown in FIG. 23.
Figure 25:
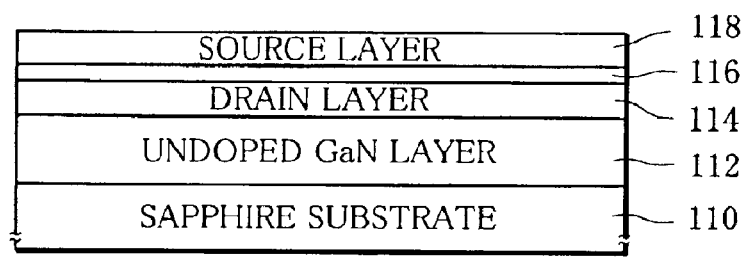
FIG. 25 is a section view showing a first process stage of a method for manufacturing the GaN-based MISFET shown in FIG. 23.
Figure 26:
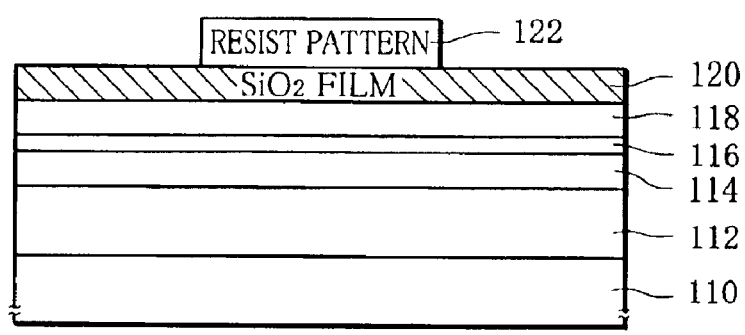
FIG. 26 is a section view showing a second process stage of the manufacturing method.
Figure 27:
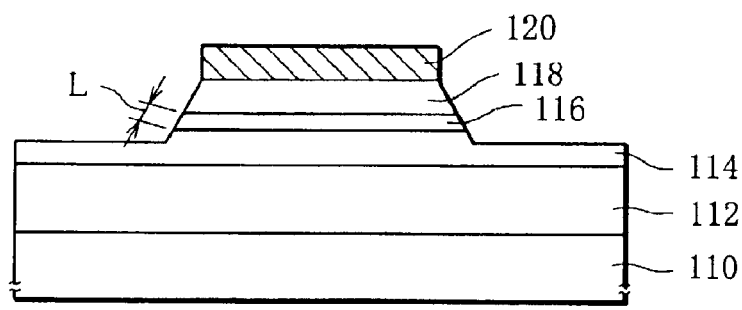
FIG. 27 is a section view showing a third process stage.
Figure 28:
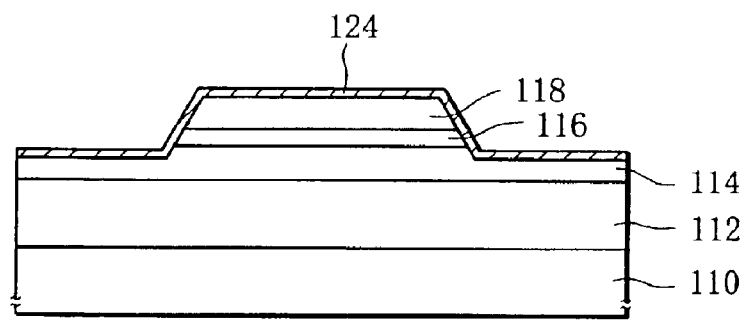
FIG. 28 is a section view showing a fourth process stage.

The present inventors calculated the on-resistance varying with the varying thickness of the p-type GaN channel layer 116. The results are shown in FIG. 24. As apparent from FIG. 24, it is confirmed that the on-resistance becomes smaller as the thickness of the p-type GaN channel layer 116 decreases. To be noted, if the p-type GaN channel layer 116 is too small in thickness, then gate control cannot be achieved, making it difficult to properly operate the FET.

The second embodiment may be modified variously.

For instance, instead of forming the first and second MISFETs 142a, 142b at two oblique side faces of a mesa structure as in the case of the second embodiment, it is possible to form a single MISFET at one of the oblique side faces. Contrary to this, for the mesa structure of quadrangular truncated pyramid, for instance, four MISFETs can be formed at its four oblique side faces. A combination of four MISFETs permits an FET operation at a larger current and contributes to the fabrication of an integrated circuit of higher density.

The mesa structure may be formed into rectangular in cross section and an MISFET may be formed on a vertical side face of the mesa structure. In such an FET structure, a channel region is formed in the p-type GaN channel layer in the vicinity of the vertical side face, the channel layer being vertically interposed between an n-type GaN source layer and an n-type GaN drain layer and the channel length L being directly represented by the thickness of the channel layer.

Instead of the p-type GaN channel layer 116, a p-type channel layer may be employed, which is made of GaN, InGaN, AlGaN, InGaNAs, InGaNP or AlInGaNP each doped with Mg impurity, or which is made of SiC doped with Al impurity or B impurity.

Instead of the n-type GaN source layer 118 and the n-type GaN drain layer 114, an n-type source layer and an n-type drain layer may be employed, which are made of InGaN, AlGaN, InGaNAs, InGaNP each doped with Si impurity or which are made of SiC doped with N impurity or P impurity.

EXAMPLE

With reference to FIGS. 25–36, an example of a method for manufacturing a GaN-based MISFET according to the second embodiment will be explained.

First, a series of crystal growth on a semi-insulating sapphire substrate 110 was done by means of a gas source molecular beam epitaxy (MBE) method using an ultra-high vacuum growth apparatus.

More specifically, a GaN buffer layer (not shown) of 50 nm thick was grown at a growth temperature of 640° C., using as raw material gases, gallium (Ga) at a partial pressure of $4 \times 10^{-5}$ Pa and radical nitrogen (N) at a partial pressure of $4 \times 10^{-4}$ Pa. Then, at a growth temperature of 850° C., an undoped GaN layer 112 of 1000 nm thick was grown using Ga and N at partial pressures of $1.33 \times 10^{-3}$ Pa and $6.65 \times 10^{-3}$ Pa, respectively.

In succession, an n-type GaN drain layer 114 of 200 nm thick with carrier concentration of $1 \times 10^{19}$ cm$^{-3}$ was grown at a growth temperature of 850° C., using Ga and N at partial pressures of $6.65 \times 10^{-3}$ Pa and $6.65 \times 10^{-3}$ Pa and adding Si, as a dopant, at a partial pressure of $6.65 \times 10^{-6}$ Pa. Then, a p-type GaN channel layer 116 of 30 nm thick with carrier concentration of $5 \times 10^{18}$ cm$^{-3}$ was grown at a growth temperature of 850° C., using Ga and N at partial pressures of $6.65 \times 10^{-7}$ Pa and $6.65 \times 10^{-3}$ Pa and adding Mg, as a dopant, at a partial pressure of $6.65 \times 10^{-6}$ Pa.

In succession, an n-type GaN source layer 118 of 200 nm thick with carrier concentration of $1 \times 10^{19}$ cm$^{-3}$ was grown at a growth temperature of 850° C., using Ga and N at partial pressures of $6.65 \times 10^{-4}$ Pa and $6.65 \times 10^{-3}$ Pa and adding Si, as a dopant, at a partial pressure of $6.65 \times 10^{-4}$ Pa. As a result, a layered structure was formed of the n-type GaN drain layer 114, the n-type GaN source layer 118, and the p-type GaN channel layer 116 vertically sandwiched between the layers 114, 118 (see FIG. 25).

For the formation of the layered structure, an organometallic gas such as triethyl gallium (TEG; Ga(C2H5)3), trimethyl gallium (TMG; Ga(CH3)3) was used for a Ga source, with dimethylhydrazine ((CH3)2.N2H4) or ammonia (NH3) for an N source, mono-silane (SiH4) for an Si source, and organic Mg such as dicyclopentadienyl Mg for an Mg source.

For the series of crystal growth, a metal organic chemical vapor deposition (MOCVD) method may be adopted instead of a gas source MBE method.

Next, an SiO$_2$ film 120 of 200 nm thick was formed on the n-type GaN source layer 118 by a plasma chemical vapor deposition (CVD) method. Instead of the SiO$_2$ film 120, an SiN$_x$ film or AlN film may be formed. In succession, patterning of a resist film applied to the SiO$_2$ film 120 was conducted by lithography, thereby forming a resist film of the desired shape (see FIG. 26).

Next, using the resist pattern 122 as a mask, patterning of the SiO$_2$ film 120 into the desired shape was conducted by selectively removing the film 120 by wet etching with BHF or dry etching with CF4. Thereafter, the resist pattern 122 was removed by means of a method using acetone or methanol or an oxygen ashing method.

Then, using the patterned SiO$_2$ film 120 as a mask, parts of the source, channel and drain layers 118, 116 and 114 were selectively removed by an electron cyclotron resonance (ECR) plasma etching method or a reactive ion beam etching (RIBE) method with a methane series gas, thereby forming a mesa structure that had oblique side faces thereof to which the source, channel and drain layers 118, 116 and 114 were exposed, so that the oblique side faces of the mesa structure were partly constituted by oblique side faces of the channel layer 116.

Thus, the oblique side faces of the p-type GaN channel layer 116, which was vertically sandwiched between the n-type GaN source and drain layers 118 and 114, were arranged to constitute a channel region of the MISFET being fabricated, and the channel length L was represented by the length measured along the oblique face of the channel region. The channel length L was 40 nm, which varies in dependence on the thickness of the channel layer 116 and the conditions for fabrication of the mesa structure, primarily on the thickness of the channel layer 116 (see FIG. 27).

Next, the SiO$_2$ film 120 was removed, and then an SiO$_2$ gate insulating film 124 of 50 nm thick was formed on the entire face of the mesa structure by the thermal CVD or plasma CVD method, to thereby cover the oblique side faces of the p-type GaN channel layer 116 by the SiO$_2$ gate insulating film 124. In succession, an interlayer insulating film 126 of 3000 nm thick made of polyimide serving as a voltage- and temperature-resistant resin was formed on the entire face of the SiO$_2$ gate insulating film (see FIG. 28).

Figure 29:
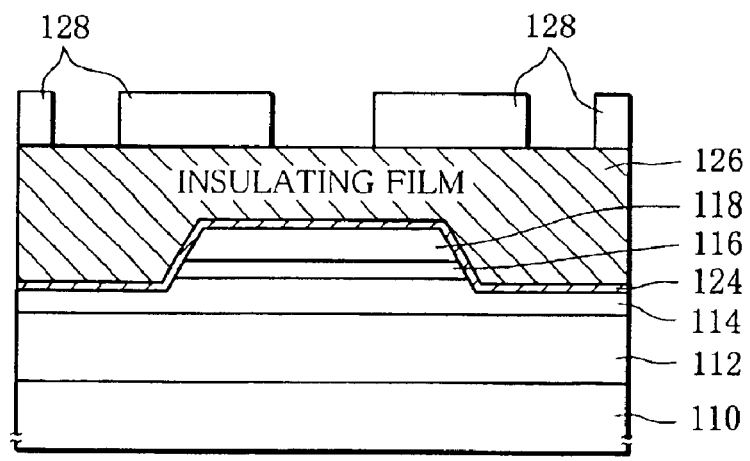
FIG. 29 is a section view showing a fifth process stage.
Figure 30:
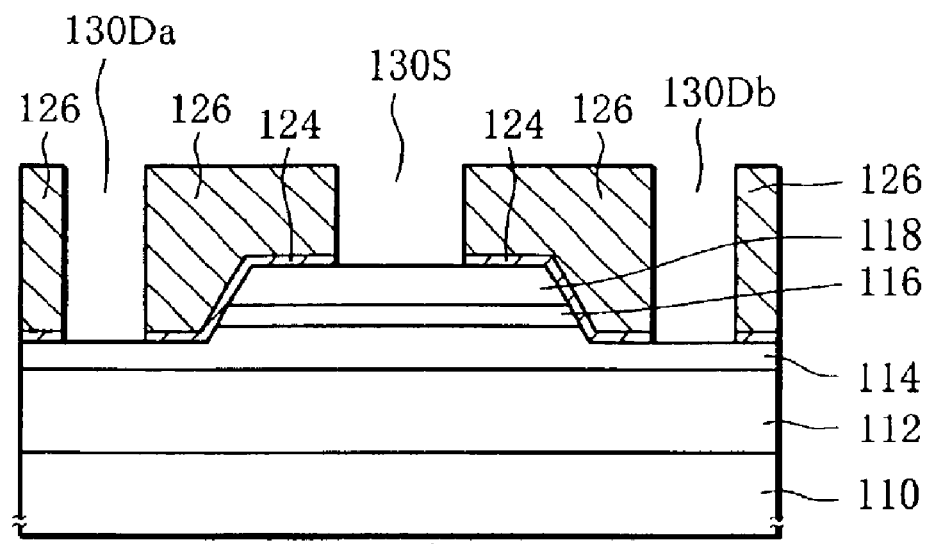
FIG. 30 is a section view showing a sixth process stage.
Figure 31:
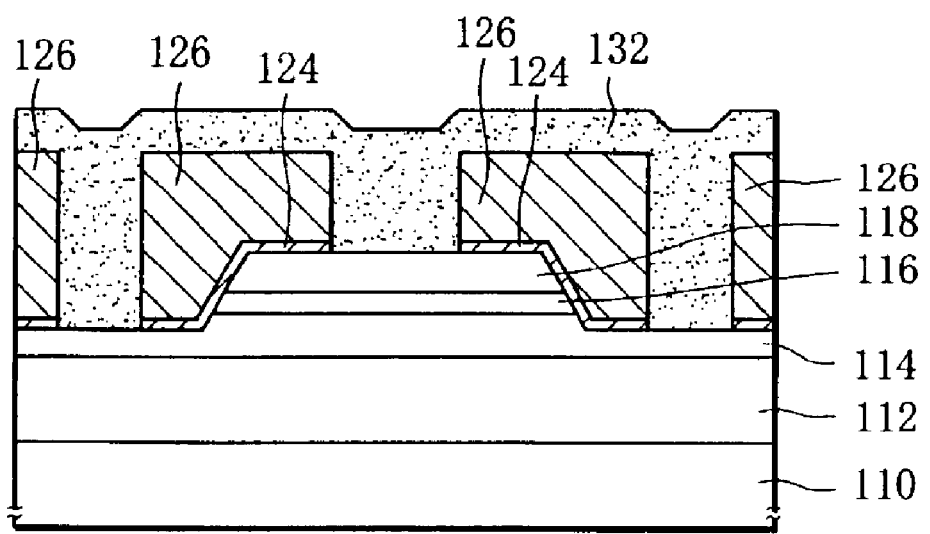
FIG. 31 is a section view showing a seventh process stage.
Figure 32:
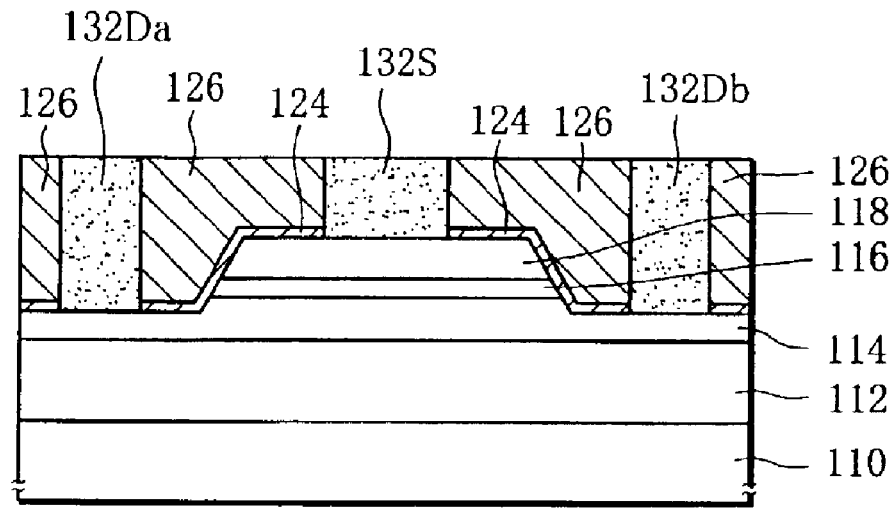
FIG. 32 is a section view showing an eighth process stage.
Figure 33:
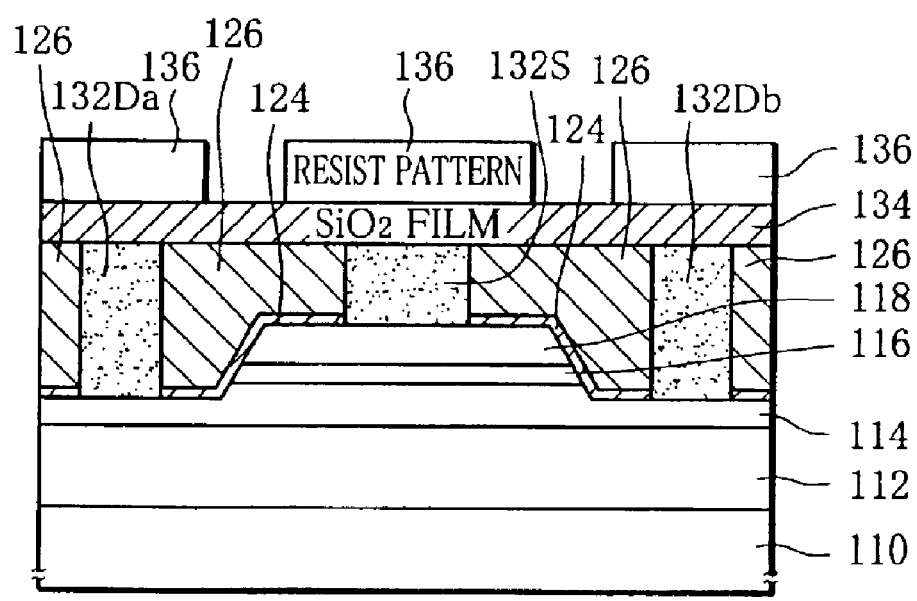
FIG. 33 is a section view showing a ninth process stage.
Figure 34:
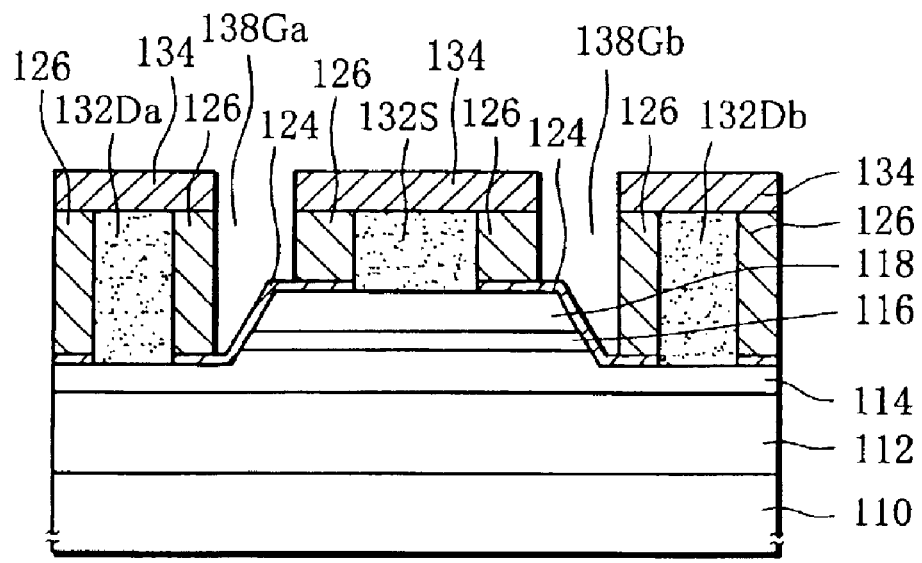
FIG. 34 is a section view showing an eleventh process stage.

Next, an electron beam (EB) resist film was applied to the interlayer insulating film 126, and patterning of the resist film was conducted by the EB lithography method, to form a resist pattern 128 permitting regions to be exposed for source and drain formation (see FIG. 29).

Next, using the resist pattern 128 as a mask, the interlayer insulating film 126 and the SiO$_2$ gate insulating film 124 were sequentially and selectively removed by etching by means of the RIBE method using a dryetching apparatus, thereby forming a contact hole 130S through which the n-type GaN source layer 118 was exposed and at the same time forming two contact holes 130Da, 130Db through which the n-type GaN drain layer 114 was exposed. Thereafter, the resist pattern 128 was removed by using acetone or methanol or the oxygen ashing method (see FIG. 30).

Next, a TaSi/Au layer 132 was formed on the entire face of the interlayer insulating film 126 formed with the contact holes 130S, 130Da and 130Db, by layering TaSi and Au in this order by means of the sputter vapor deposition method using Ar plasma, for instance, with the contact holes 130S, 130Da and 130Db filled with the TaSi/Au layer 132. TaSi served as an electrode material having good adhesion with the SiO$_2$ gate insulating film 124 and a small contact resistance with the n-type GaN source and drain layers 118 and 114 (See FIG. 31). Instead of the TaSi/Au layer 132, a layer of WSi/Au, TaSi, AlSi/Au, NiSi/Au or the like may be formed.

Next, the TaSi/Au layer 132 and the interlayer insulating film 126 were polished by means of the chemical mechanical polishing (CMP) method, whereby only those parts of the TaSi/Au layer 132 which were filled in the contact holes 130S, 130Da and 130Db were remained and separated from one another, and surfaces of the TaSi/Au layer 132 and the interlayer insulating film 126 were made flush into a flat face.

Thus, a source electrode 132S was formed that was comprised of the TaSi/Au layer 132 filled in the contact hole 130S and ohmic-contacted with the n-type GaN source layer 118. At the same time, two drain electrodes 132Da and 132Db were formed that were comprised of the TaSi/Au layers 132 filled in the contact holes 130Da and 130Db and ohmic-contacted with the n-type GaN drain layer 114 (see FIG. 32).

Next, an $SiO_2$ film 134 of 200 nm thick was formed on the entire faces of the interlayer insulating film 126 and the source and drain electrodes 132S, 132Da and 132Db by the plasma CVD method, for instance. In succession, an EB resist film was applied to the $SiO_2$ film 134, and patterning of the EB resist film was conducted by the EB lithography method to form a resist pattern 136 such that regions for gate formation were exposed therethrough (see FIG. 33)

Next, using the resist pattern 136 as a mask, the $SiO_2$ film 134 and the interlayer insulating film 126 were selectively and sequentially removed by etching by means of the RIBE method using a dryetching apparatus, to form two contact holes 138Ga and 138Db through which the $SiO_2$ gate insulating film 124 was exposed that covered the oblique side faces of the p-type GaN channel layer 116. Subsequently, the resist pattern 136 was removed by using acetone or methanol or the oxygen ashing method (see FIG. 34).

Figure 35:
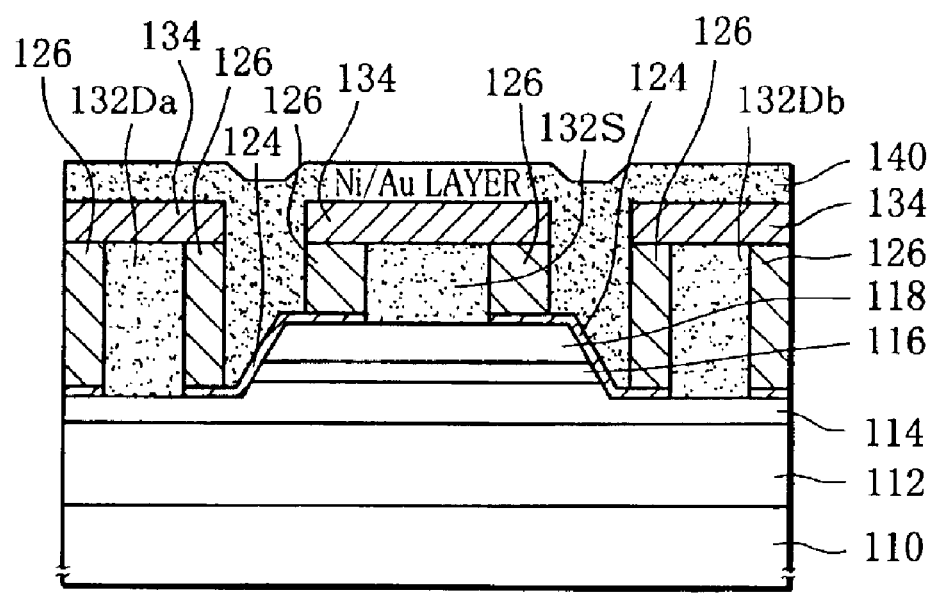
FIG. 35 is a section view showing a twelfth process stage.

Next, an Ni/Au layer 140 was formed by sequentially layering Ni and Au on the entire face of the $SiO_2$ film 134 formed with the contact holes 138Ga and 138Gb by means of the sputter vapor deposition method using Ar plasma, for instance, with the contact holes 138Ga and 138Gb filled with the Ni/Au layer 140 (see FIG. 35).

Next, by the CMP method, for instance, the Ni/Au layer 140 and the $SiO_2$ film 134 were polished until surfaces of the source and drain electrodes 132S, 132Da and 132Db were exposed so that only those parts of the Ni/Au layer 140 filled in the contact holes 138Ga and 138Gb were remained to be separated from each other, and surfaces of the drain electrodes 132Da, 132DB and the interlayer insulating film 126 were made flush to constitute a flat face. As a result, two gate electrodes 140Ga and 140Gb were formed that were constituted by the Ni/Au layers 140 filled in the contact holes 138Ga, 138Gb to be in contact with the $SiO_2$ film 124.

Figure 36:
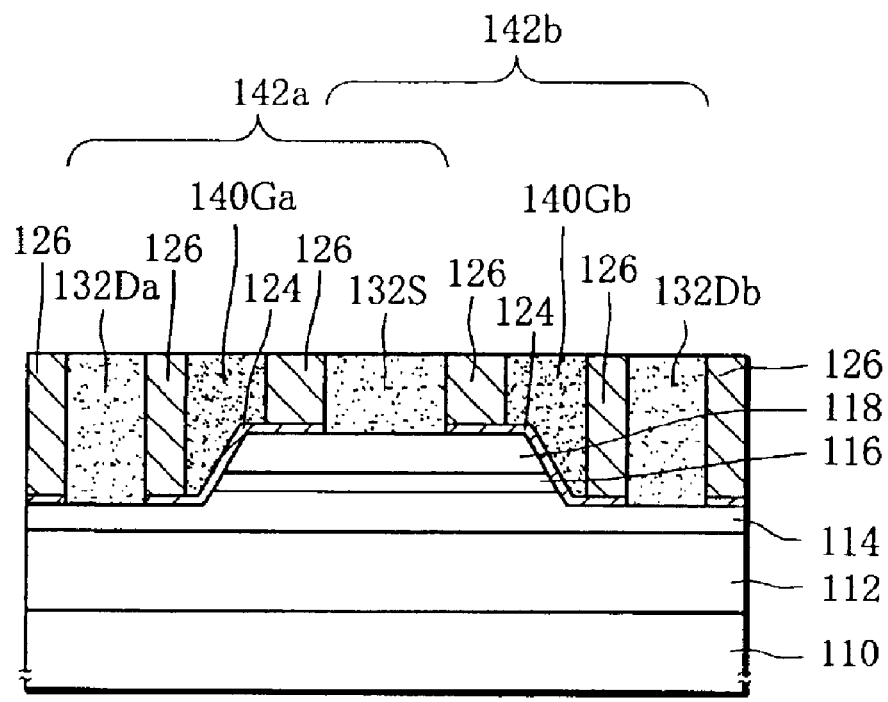
FIG. 36 is a section view showing a thirteenth process stage.
Figure 37:
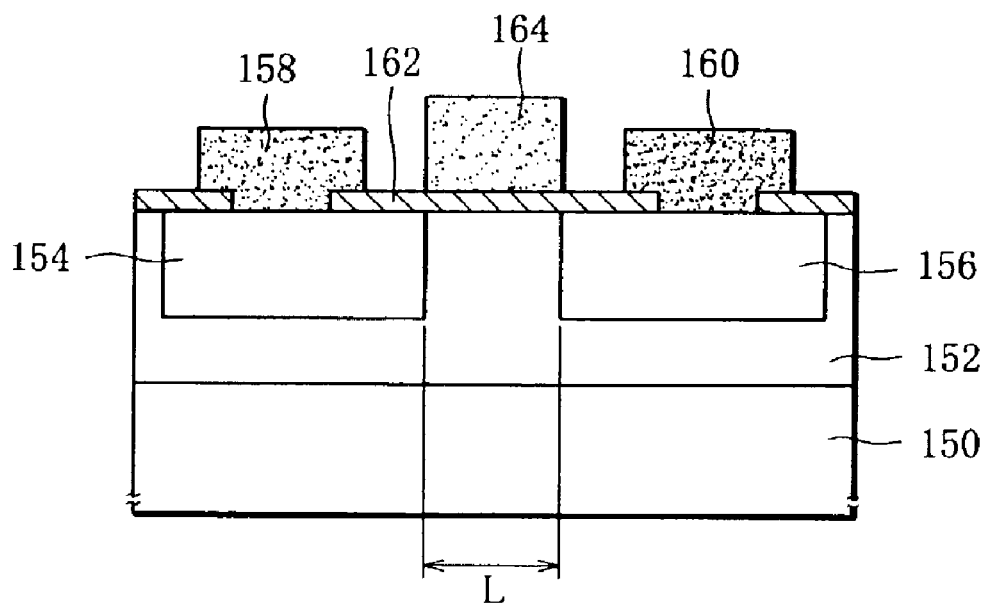
FIG. 37 is a schematic section view showing a conventional GaN-based MISFET.

Thus, first and second enhancement-type MISFETs 142a, 142b were adjacently formed that had the source electrode 132S, drain electrodes 132Da, 132Db and gate electrodes 140Ga, 140Gb, with the source and drain electrodes 132S, 132Da and 132Db being individually ohmic-connected with the n-type GaN source and drain layers 118, 114, and with the gate electrodes 140Ga, 140Gb being formed, via $SiO_2$ gate insulating film 124, on opposite oblique side faces of the p-type GaN channel layer 116 which was vertically sandwiched between the n-type GaN source and drain layers 118, 114 (see FIG. 36).

Although illustrations are omitted, using a multilayer interconnection method, interconnection layers were formed that extended through contact holes formed in an interlayer insulating film of, e.g., polyimide formed on the electrodes and the interlayer insulating film 126 and were individually connected to the source, drain and gate electrodes 132S, 132Da, 132Db, 140Ga and 140Gb. Thus, an intended integrated circuit was fabricated that was constituted by the first and second MISFETs 142a, 142b connected with each other through the interconnection layers.

With the series of processes explained above, the GaN-based MISFET as shown in FIG. 23 was fabricated.

According to the manufacturing method of this embodiment, the CMP method is adapted for the formation of the source, drain and gate electrodes 132S, 132Da, 132Db, 140Ga and 140Gb, and therefore, surfaces of these electrodes and the $SiO_2$ gate insulating film 124 can be made flush to form a flat face, even though the n-type GaN source and drain layers 118, 114 and the $SiO_2$ gate insulating film 124 arranged in contact with the electrodes have different height dimensions. This makes it easy to carry out operations for multilayer interconnection after the formation of the first and second MISFETs 142a, 142b.

What is claimed is:

1. A field effect transistor comprising:
   a channel layer constituted by a wide bandgap semiconductor;
   a source region provided on a first side of said channel layer;
   a drain region provided on a second side of said channel layer;
   an insulating resin film comprised of a voltage- and heat-resisting resin, said insulating resin film being so formed as to cover the channel layer, the source region and the drain region;
   contact holes formed by selectively removing the insulating resin film so as to be open are filled with an electrode material;
   gate, source and drain electrodes constituted by the electrode material are individually filled in said contact holes; and
   contact regions are constituted by semiconductor layers that are formed by making embedding-growth on opposite ends of the channel layer so that the channel layer is sandwiched there between.

2. The field effect transistor according to claim 1, wherein said source region is comprised of a first contact region provided in contact with one end of said channel layer, the one end serving as the first side of the channel layer,
   said drain region being comprised of a second contact region provided in contact with another end of the channel layer, said another end serving as the second side of the channel layer, and
   said gate, source and drain electrodes being individually provided on said channel layer and said first and second contact regions, and being separated from one another by said insulating resin film.

3. The field effect transistor according to claim 2, wherein said insulating resin film is comprised of a polyimide film.

4. The field effect transistor according to claim 2, wherein said channel layer constitutes a heterojunction structure of an electron supply layer and an electron transit layer that have different bandgaps, and
   said gate, source and drain electrodes being constituted by the same material.

5. The field effect transistor according to claim 4, wherein said electron supply layer and said electron transit layer are constituted by an AlGaN layer and a GaN layer, respectively.

6. The field effect transistor according to claim 2, wherein the wide bandgap semiconductor constituting said channel layer is constituted by a GaN-based semiconductor.

7. The field effect transistor according to claim 2, further comprising:

a gate insulating film formed on said channel layer, wherein said gate electrode is provided on the gate insulating film.

8. The field effect transistor according to claim 2, wherein each of said source and drain regions is constituted by a wide bandgap semiconductor, and the electrode material constituting each of the source and drain electrodes has a layered structure of a metal silicide layer and an Au layer formed thereon.

9. The field effect transistor according to claim 8, wherein the metal silicide layer is constituted by a silicide alloy of Ta, W, Al, or Ni.

10. The field effect transistor according to claim 7, wherein the gate insulating film is constituted by SiO.sub.2. SiN.sub.x, or AlN.

11. A field effect transistor comprising:

a channel layer constituted by a wide bandgap semiconductor;

a source region provided on a first side of said channel layer;

a drain region provided on a second side of said channel layer;

an insulating resin film comprised of a voltage- and heat-resisting resin, said insulating resin film being so formed as to cover the channel layer, the source region and the drain region;

contact holes formed by selectively removing the insulating resin film so as to be open are filled with an electrode material;

gate, source and drain electrodes constituted by the electrode material are individually filled in said contact holes, a gate insulating film provided on a side face of said channel layer, wherein said source and drain regions are individually disposed on upper and lower sides of said channel layer, the upper and lower sides serving as the first and second sides of the channel layer, said source and drain regions cooperating with said channel layer to constitute a layered structure having a side face thereof extending obliquely or vertically, and said gate electrode being provided on a side face of the channel layer via the gate insulating film, the side face of the channel layer constituting a part of the side face of the layered structure.

12. The field effect transistor according to claim 11, wherein the layered structure is fabricated into a mesa shape.

13. The field effect transistor according to claim 11, wherein the wide bandgap semiconductor constituting said channel layer is a III–V group nitride compound semiconductor.

14. The field effect transistor according to claim 13, wherein the III–V group nitride compound semiconductor is GaN, InGaN, AlGaN, InGaNAs, InGaNP, or AlLnGaNP.

15. The field effect transistor according to claim 11, wherein the wide bandgap semiconductor constituting the channel layer is a IV—IV group compound semiconductor.

16. The field effect transistor according to claim 15, wherein the IV—IV group compound semiconductor is SiC.

17. The field effect transistor according to claim 11, wherein each of said source and drain regions is constituted by a wide bandgap semiconductor, and the electrode material constituting each of the source and drain electrodes has a layered structure of a metal silicide layer and an Au layer formed thereon.

18. The field effect transistor according to claim 17, wherein the metal silicide layer is constituted by a silicide alloy of Ta, W, Al, or Ni.

19. The field effect transistor according to claim 11, wherein the gate insulating film is constituted by SiO.sub.2, SiN.sub.x, or AlN.

\* \* \* \* \*